(12) United States Patent
Mann et al.

(10) Patent No.: US 9,134,626 B2
(45) Date of Patent: Sep. 15, 2015

(54) MICROSCOPE AND MICROSCOPY METHOD FOR SPACE-RESOLVED MEASUREMENT OF A PREDETERMINED STRUCTURE, IN PARTICULAR A STRUCTURE OF A LITHOGRAPHIC MASK

(75) Inventors: Hans-Juergen Mann, Oberkochen (DE); Michael Totzeck, Schwaebisch Gmuend (DE); Norbert Kerwien, Moegglingen (DE)

(73) Assignee: Carl Zeiss SMS GmbH, Jena (DE)

( * ) Notice: Subject to any disclaimer, the term of this patent is extended or adjusted under 35 U.S.C. 154(b) by 1349 days.

(21) Appl. No.: 12/517,583

(22) PCT Filed: Nov. 20, 2007

(86) PCT No.: PCT/EP2007/010044
§ 371 (c)(1),
(2), (4) Date: Jan. 7, 2010

(87) PCT Pub. No.: WO2008/071294
PCT Pub. Date: Jun. 19, 2008

(65) Prior Publication Data
US 2010/0142042 A1    Jun. 10, 2010

Related U.S. Application Data

(60) Provisional application No. 60/870,287, filed on Dec. 15, 2006.

(30) Foreign Application Priority Data

Dec. 15, 2006    (DE) .................. 10 2006 059 435

(51) Int. Cl.
*G02B 27/28*    (2006.01)
*G03F 7/20*    (2006.01)
(Continued)

(52) U.S. Cl.
CPC ........ *G03F 7/70625* (2013.01); *G02B 21/0092* (2013.01); *G02B 21/06* (2013.01);
(Continued)

(58) Field of Classification Search
CPC .... G02B 21/0092; G02B 21/06; G02B 21/16; G02B 27/28; G02B 27/283; G03F 1/0092; G03F 7/70616; G03F 7/70625
USPC .................................................. 359/385–388
See application file for complete search history.

(56) References Cited

U.S. PATENT DOCUMENTS 4,795,246 A * 1/1989 Lord ............................. 359/371
6,111,690 A * 8/2000 Tanaami ....................... 359/368
(Continued)

FOREIGN PATENT DOCUMENTS

EP    1 882 968    1/2008
JP    11-249026    9/1999
(Continued)

OTHER PUBLICATIONS

N. Kerwien, "Polarisationsmikroskopie im DUV", *DGAO-Proceedings* 2004.
(Continued)

*Primary Examiner* — Thong Nguyen
(74) *Attorney, Agent, or Firm* — Fish & Richardson P.C.

(57) ABSTRACT

A microscope is provided for space-resolved measurement of a predetermined structure. The microscope includes a source of radiation, which emits electromagnetic radiation of a predetermined wavelength, an optical system, which irradiates the electromagnetic radiation onto the structure to be measured and images the structure, irradiated with the electromagnetic radiation, onto a detector. The optical system has two eigen polarization conditions, and the optical system includes a polarization module by which a polarization condition can be set for the electromagnetic radiation of the source of radiation, the polarization conditions corresponding to the eigen polarization conditions.

25 Claims, 3 Drawing Sheets

(51) Int. Cl.
  *G02B 21/00* (2006.01)
  *G02B 21/06* (2006.01)
  *G02B 21/16* (2006.01)
  *G03F 1/00* (2012.01)

(52) U.S. Cl.
  CPC ............... *G02B 21/16* (2013.01); *G02B 27/28* (2013.01); *G03F 7/70616* (2013.01); *G02B 27/283* (2013.01); *G03F 1/0092* (2013.01)

(56) References Cited

U.S. PATENT DOCUMENTS

2006/0146384 A1* 7/2006 Schultz et al. .................... 359/9
2009/0040601 A1* 2/2009 Saito et al. .................... 359/386

FOREIGN PATENT DOCUMENTS

JP    2001-356276    12/2001
WO    2006/123712    11/2006

OTHER PUBLICATIONS

International Search Report for International Application No. PCT/EP2007/010044 dated Mar. 6, 2008.
International Preliminary Report on Patentability, International Application No. PCT/EP2007/010044, 8 pages, issued Jun. 16, 2009.

* cited by examiner

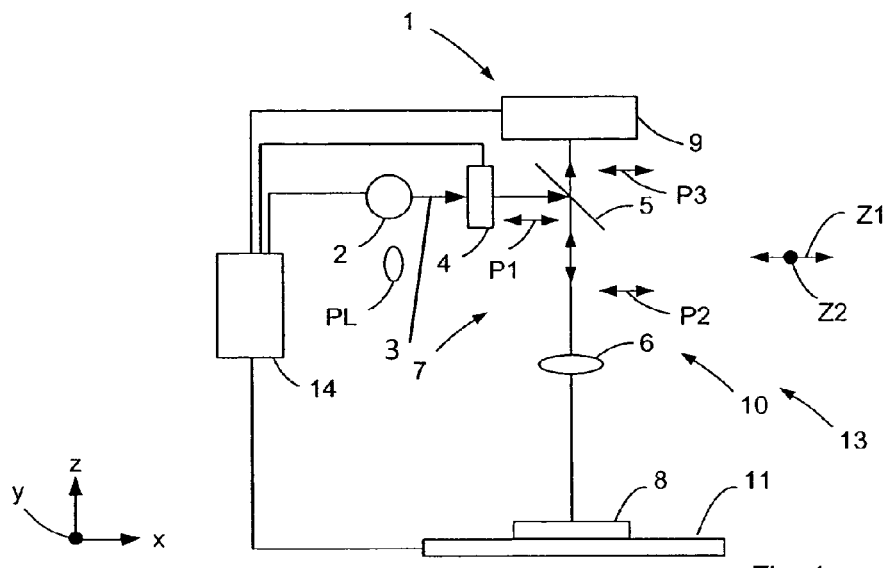
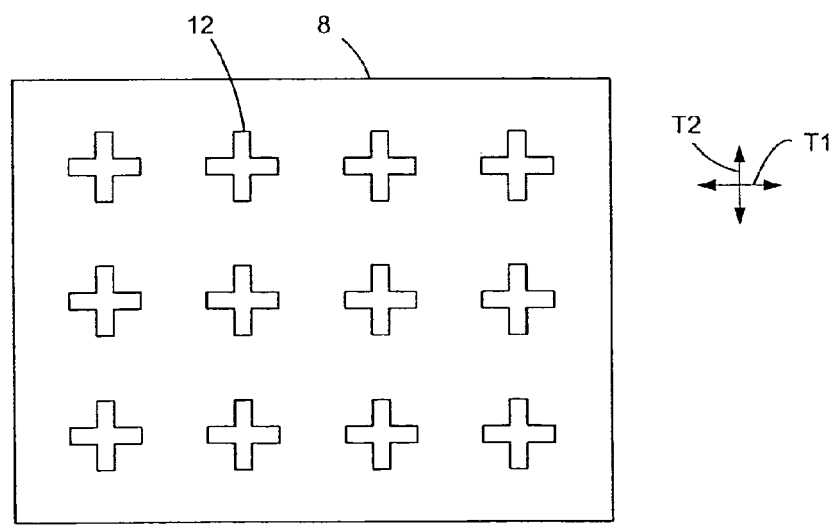
Fig. 1
Fig. 2

MICROSCOPE AND MICROSCOPY METHOD FOR SPACE-RESOLVED MEASUREMENT OF A PREDETERMINED STRUCTURE, IN PARTICULAR A STRUCTURE OF A LITHOGRAPHIC MASK

CROSS-REFERENCE TO RELATED APPLICATIONS

This application is the National Stage of International Application No. PCT/EP2007/010044, filed Nov. 20, 2007, which claims priority to German Application No. 10 2006 059 435.5, filed Dec. 15, 2006, and U.S. Provisional Application No. 60/870,287, filed Dec. 15, 2006. The entire contents of the above applications are incorporated herein by reference.

In a microscope for space-resolved measurement of a predetermined structure and a corresponding microscopy method, the predetermined structure is imaged onto a detector, with the contrast in the optical image on the detector strongly depending on the polarization condition of the irradiated light. Moreover, effects of electromagnetic interaction can cause a variation in the position of an edge of the structure in the optical image, depending on the polarization condition of the electromagnetic radiation used to illuminate the structure.

The polarization condition of the electromagnetic radiation for illumination of the predetermined structure has not been taken into account in such microscopes so far. Also, changes in polarization properties, which change results from the optics of the microscope, e.g. from polarization-dependent properties of the lens coatings, intrinsic birefringence, stress-induced birefringence of glasses, as well as, in particular, of mirrors and beam splitters, are not taken into account and lead to errors of measurement.

In view thereof, it is an object of the invention to provide a microscope and a microscopy method for space-resolved measurement of a predetermined structure, which allows higher accuracy to be achieved.

According to the invention, the object is achieved by a microscope for space-resolved measurement of a predetermined structure, said microscope comprising a source of radiation, which emits electromagnetic radiation of a predetermined wavelength; an optical system, which irradiates electromagnetic radiation onto the structure to be measured and images said structure, irradiated with the electromagnetic radiation, onto a detector,
wherein the optical system has two eigen polarization conditions and the apparatus includes a polarization module by which a polarization condition can be set for the electromagnetic radiation of the source of radiation, which condition comprises only those components of a known quantity which correspond to the eigen polarization conditions.

Since the eigen polarization conditions (intrinsic polarization conditions) of the optical system are polarization conditions which are not modified when passing through the optical system, this has the advantageous effect that the optical system does not lead to any polarization-dependent deterioration during measurement. On the basis of the known amounts of those components of the electromagnetic radiation for illumination of the structure which correspond to the eigen polarization conditions, the polarization-dependent error can then be taken into account, for example computationally, during imaging onto the detector, so that a very high precision of measurement can be achieved.

In contrast to the measuring methods of imaging polarimetry, which aim to analyze the polarization condition in the image by varying the polarization condition in the illumination and imaging beam paths, the polarization condition is defined as precisely as possible according to the present invention. Therefore, preferably no variation of the polarization condition is effected during the measurement process.

The microscope can measure the predetermined structure by transmission and/or reflection. If it measures the structure by reflection, preferably at least one optical element of the optical system is employed for both illumination and detection. The microscope can also be provided such that switching between transmission measurement and reflection measurement is possible.

The optical system of the microscope may comprise illumination optics for irradiating the electromagnetic radiation onto the structure to be measured, as well as detection optics for imaging the irradiated structure onto the detector, wherein the eigen polarization conditions of the illumination optics and/or of the detection optics correspond to the eigen polarization conditions of the optical system. In particular, the eigen polarization conditions of the illumination optics and of the detection optics may coincide and, thus, correspond to the eigen polarization conditions of the optical system.

In particular, the eigen polarization conditions of the optical system are linear polarization conditions and the polarization condition of the electromagnetic radiation which can be set by means of the polarization module coincides with one of said two linear polarization conditions. This is particularly easy to realize. In particular, the eigen polarization conditions of the predetermined structure are frequently also linear polarization conditions, so that also the structure itself does not exert any polarization-dependent negative influence on measurement.

The predetermined structure may generally comprise two eigen polarization conditions, wherein at least one of said two eigen polarization conditions of the predetermined structure coincides with at least one of the eigen polarization conditions of the optical system.

This may be realized by a suitable design of the optical system, a suitable selection of the structure and/or suitable orientation of the structure relative to the optical system.

The optical system may further comprise an eigen polarization unit, by which the two eigen polarization conditions of the optical system can be modified. Thus, the eigen polarization conditions of the optical system can be adapted to the respective eigen polarization conditions of the predetermined structure to be examined (which generally comprises elliptical eigen polarization conditions).

In particular, the polarization module can be used to set a polarization condition of the electromagnetic radiation under which the contrast of the image of the predetermined structure recorded by the detector is at a maximum.

In particular, the microscope serves to measure a structure on a lithographic mask or on a semiconductor wafer.

The source of radiation is, in particular, a laser source. It may emit in the deep UV-range, for example at a wavelength of 193 nm.

The predetermined maximum wavefront error of may be $\lambda/10$, $\lambda/150$, or even $\lambda/100$, wherein $\lambda$ refers to the predetermined wavelength of the electromagnetic radiation of the source of radiation.

Further, a microscopy method for space-resolved measurement of a predetermined structure is provided, wherein a source of radiation emits electromagnetic radiation of a predetermined wavelength, an optical system having two eigen polarization conditions irradiates the electromagnetic radiation onto the structure to be measured and images said structure, irradiated with said electromagnetic radiation, onto a detector, wherein a polarization condition is set for the electromagnetic radiation of the source or radiation, which polarization condition comprises only components of a known quantity which correspond to the eigen polarization conditions.

This has the effect that the optical system causes no polarization-dependent deterioration during measurement of the predetermined structure.

The predetermined structure can be measured by reflection and/or transmission. Further, it is possible to carry out the reflection and transmission measurements after each other in any desired sequence.

The optical system may comprise illumination optics for irradiating the electromagnetic radiation onto the predetermined structure, and detection optics for imaging the irradiated structure onto a detector, wherein the eigen polarization conditions of the illumination optics and/or of the detection optics correspond to the eigen polarization conditions of the optical system. In particular, the eigen polarization conditions of the illumination optics and of the detection optics may coincide and, thus, correspond to the eigen polarization conditions of the optical system.

Further the eigen polarization conditions may be linear polarization conditions and the set polarization condition of the electromagnetic radiation may coincide with one of said two linear polarization conditions.

The predetermined structure may have two eigen polarization conditions, wherein at least one of said two eigen polarization conditions of the predetermined structure coincides with at least one of the eigen polarization conditions of the optical system.

The optical system may comprise an eigen polarization condition, by which the two eigen polarization conditions of the optical system can be modified. This allows the eigen polarization conditions of the optical system to be adapted to the predetermined structure to be examined respectively.

Further, it is possible to set a polarization condition of the electromagnetic radiation under which the contrast of the image of the predetermined structure recorded by means of the detector becomes maximal.

Using the microscopy method, in particular, structures on a lithographic mask or on a semiconductor wafer are measured.

The maximum wavefront error may be $\lambda/10$, $\lambda/50$, or even $\lambda/100$.

It is evident that the features mentioned above and those mentioned below, which are yet to be explained, can be used not only in the combinations mentioned, but also in any other combinations, or alone, without departing from the scope of the present invention.

The invention will be explained in more detail below, by way of example and with reference to the enclosed Figures, which also disclose essential features of the invention. In the drawings:

FIG. 1 shows a first embodiment of the microscope according to the invention;

FIG. 2 shows a schematic top view of the lithographic mask 8 of FIG. 1, and

Figure 3:
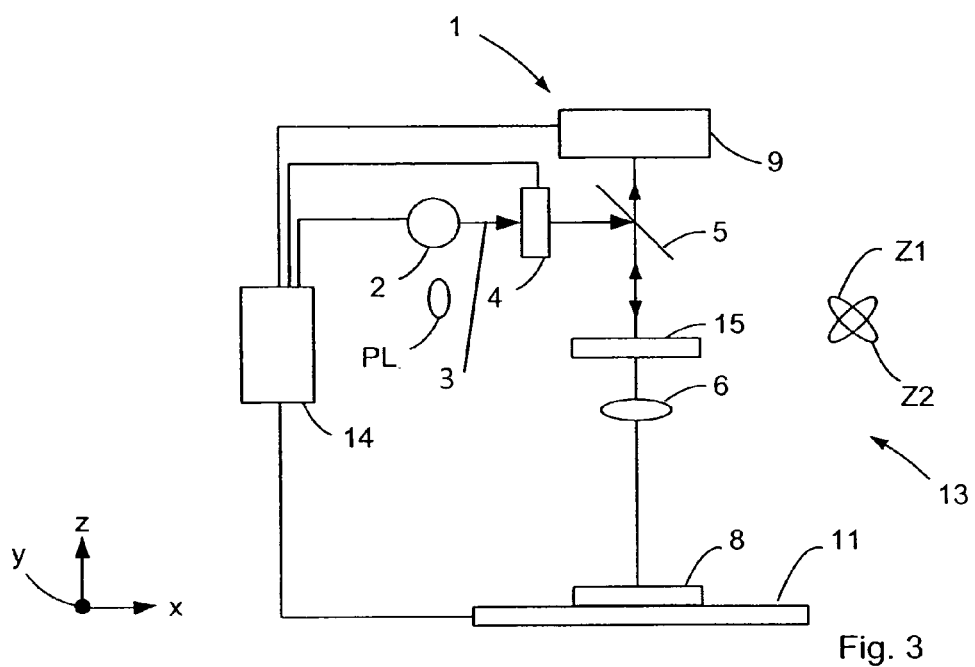
FIG. 3 shows a second embodiment of the microscope according to the invention.

In the embodiment shown in FIG. 1, the measurement apparatus 1 according to the invention, for space-resolved measurement of a structure (in this case, on a lithographic mask 8) comprises a source of radiation 2 emitting electromagnetic radiation 3 of a wavelength of 193 nm, as well as, in this order, a polarization module 4, a beam splitter 5, and imaging optics 6.

The polarization module 4, the beam splitter 5, and the imaging optics 6 together form illumination optics 7, which irradiate the lithographic mask 8 with the electromagnetic radiation 3 coming from the source of radiation 2.

The radiation reflected by the lithographic mask 8 passes through the imaging optics 6 and is transmitted by the beam splitter 5 (at least partially) to a detector 9, which is arranged following the beam splitter 5 and may be provided, for example, as a liquid crystal display (LCD) detector. The imaging optics 6, together with the beam splitter 5, form detection optics 10 for the optical radiation reflected by the lithographic mask 8. The detection optics 10 and the illumination optics 7 together form an optical system 13.

In this case, the imaging optics 6 are represented only schematically. They can be provided, in particular, as microscope optics, comprising objective optics and tube optics, and can, thus, comprise several optical imaging elements, wherein the beam splitter 5 can be arranged between these imaging elements (preferably in an infinite beam path).

The measurement apparatus 1 further comprises a mask stage 11, which is provided, for example, as an x-y stage, to allow positioning of predetermined test structures 12 of the lithographic mask 8 in the detection region of the measurement apparatus 1.

FIG. 2 schematically shows several test structures 12 in a top view of the lithographic mask 8. As is evident from FIG. 2, said test structures can be provided as crosses; the representation in FIG. 2 is not to scale, and the size of the test structures is shown strongly enlarged. Between the test structures, the mask structures (not shown) are present which are required for exposure of a wafer in a lithographic exposure apparatus.

For control of the measurement apparatus 1, a control unit 14 (FIG. 1) is provided, which is connected to the mask stage 11, to the detector 9 and optionally also to the source of radiation 2, as well as to the polarization module 4.

The optical system 13 of the measurement apparatus 1 has the eigen polarization conditions Z1 and Z2 schematically represented in FIG. 1. Both eigen polarization conditions Z1 and Z2 are linear polarization conditions, which are oriented in the x-direction as well as perpendicular to the drawing plane. These eigen polarizations conditions Z1 and Z2 may be caused, for example, by the beam splitter 5. In order to simplify the description, the imaging optics 6 are regarded here as not influencing the polarization condition of the electromagnetic radiation transmitted through them.

Further, the polarization condition of the electromagnetic radiation 3 emitted by the source of radiation 2 is indicated. As schematically indicated by the circle in the drawing, this may be, for example, a circular polarization PL.

The polarization module 4 is adapted to convert the electromagnetic radiation 3 having said circular polarization into a linear polarization coinciding with the eigen polarization condition Z1, or to transmit only this component, so that the electromagnetic radiation incident on the beam splitter 5 has a polarization P1 which coincides with the first eigen polarization condition Z1 of the optical system 13. This has the advantageous effect that the polarization P2 of the electromagnetic radiation 3 in the illumination optics 7 is not changed. Of course, the polarization module may be adapted such that electromagnetic radiation of any polarization is converted to the eigen polarization condition of the optical system or only the corresponding component is transmitted.

The polarization condition of the electromagnetic radiation is not changed even by reflection at the test structure 12, because a first eigen polarization condition T1 of the test structure coincides with the polarization condition P2 of the electromagnetic radiation incident on the test structure 12. The first eigen polarization condition T1 of the test structure is represented together with the second eigen polarization condition T2 of the test structure in FIG. 2 (these are linear polarization conditions).

Also, the polarization P2, P3 of the reflected electromagnetic radiation passing through the detection optics 10 is not modified, because the detection optics 10 have the same eigen polarization conditions Z1 and Z2 as the illumination optics 7. The reflected radiation, having the linear polarization P3 schematically indicated in FIG. 1, is then incident on the detector 9.

By setting the polarization of the electromagnetic radiation 3 to one of the eigen polarization conditions Z1 of the optical system, polarization-dependent imaging errors can be minimized. Thereby, the test structure can be measured by the measurement apparatus 1 with extreme precision.

FIG. 3 shows an improvement of the measurement apparatus of FIG. 1, wherein the same elements are designated by the same reference numerals and, for description thereof, reference is made to the above statements.

In contrast to the measurement apparatus 1 of FIG. 1, there is arranged, in the optical system 13 between the beam splitter 5 and the imaging optics 6 of the measurement apparatus 1 in FIG. 3, an eigen polarization unit 15 which causes the eigen polarization conditions Z1 and Z2 of the optical system 13 to be elliptically polarized conditions. In this case, the polarization module 4 is provided such that the electromagnetic radiation 3 coming from the polarization module 4 is elliptically polarized (according to one of the eigen polarization conditions Z1 and Z2). Thus, the embodiment of FIG. 3 also achieves the advantage that the optical system 13 does not change the polarization condition which coincides with one of its eigen polarization conditions Z1, Z2.

In particular, this allows the eigen polarization conditions of the measurement system to be freely adapted to those of the structure to be examined. Moreover, the eigen polarization unit 15 can be used to correct polarization aberrations such that a maximum polarization-dependent wavefront error of $\lambda/10$ or $\lambda/50$, or $\lambda/100$, respectively, is not exceeded.

The eigen polarization unit 15 can be controllable such that different eigen polarization conditions can be set under the control of the control unit 14. Preferably, these are defined depending on the eigen polarization conditions T1, T2 of the test structures 12 to be examined.

Figure 4:
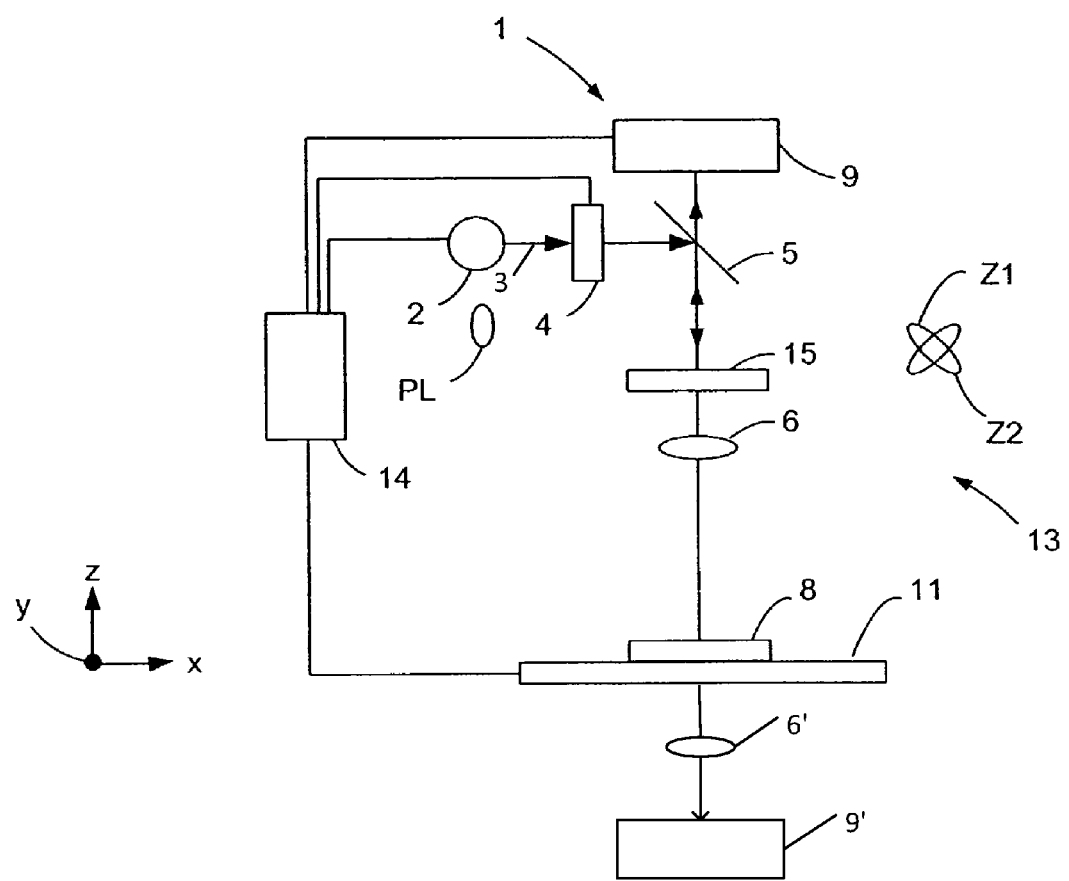
FIG. 4 shows a third embodiment of the microscope according to the invention.

FIG. 4 shows a measurement apparatus used to carry out transmission measurements of the predetermined structure. The radiation transmitted by lithographic mask 8 passes through imaging optics 6' and is transmitted to a detector 9'. In some examples, the transmission measurements can be carried out after the reflection measurements. In some examples, the reflection measurements can be carried out after the transmission measurements.

The invention claimed is:

1. A microscope for space-resolved measurement of a predetermined structure, said microscope comprising
   a source of radiation, which emits electromagnetic radiation of a predetermined wavelength,
   an optical system, which irradiates the electromagnetic radiation onto the structure to be measured and images the structure, irradiated with the electromagnetic radiation, onto a detector, the optical system comprising a polarization module configured to set a polarization condition of the electromagnetic radiation of the source of radiation;
   wherein the optical system has two optical polarization conditions, the set polarization condition of the electromagnetic radiation is one of the two optical polarization conditions, the set polarization condition of the electromagnetic radiation is not changed upon impinging the structure.

2. The microscope as claimed in claim 1, wherein the optical system uses at least one optical element for both illumination and detection.

3. The microscope as claimed in claim 1, wherein the optical system comprises illumination optics for illuminating the structure and detection optics for imaging the structure onto the detector, wherein optical polarization conditions of the illumination optics and of the detection optics correspond to the optical polarization conditions of the optical system.

4. The microscope as claimed in claim 3, wherein:
   the optical system further comprises an optical polarization unit; and the optical polarization unit and the polarization module are configured to be used together so that the optical polarization conditions of the illumination optics and of the detection optics can be modified independently of each other.

5. The microscope as claimed in claim 1, wherein the optical polarization conditions of the optical system are linear polarization conditions, and the polarization condition of the electromagnetic radiation which can be set by means of the polarization module coincides with one of the two linear polarization conditions.

6. The microscope as claimed in claim 1, wherein the structure to be measured comprises two optical polarization conditions, wherein one of said two optical polarization conditions of the structure coincides with one of the optical polarization conditions of the optical system.

7. The microscope as claimed in claim 1, wherein the optical system further comprises an optical polarization unit, by which the two optical polarization conditions of the optical system can be modified.

8. The microscope as claimed in claim 7, wherein the optical polarization unit is configured to correct polarization aberrations such that a predetermined maximum polarization-dependent wavefront error is not exceeded.

9. The microscope as claimed in claim 7, wherein the optical polarization unit is configured such that there is no variation of the optical polarization conditions of the optical system during measurement of the predetermined structure when the electromagnetic radiation is transmitted or reflected by the predetermined structure.

10. The microscope as claimed in claim 1, wherein the polarization module is configured such that there is no variation of the set polarization condition during measurement of the predetermined structure when the electromagnetic radiation is transmitted or reflected by the predetermined structure.

11. The microscope as claimed in claim 1, wherein the microscope can measure by reflection and by transmission and is switchable between these modes of measurement.

12. The microscope as claimed in claim 1, wherein the polarization module is configured to set a polarization condition of the electromagnetic radiation so that a contrast of the image of the structure recorded by the detector is at a maximum.

13. A microscopy method for space-resolved measurement of a predetermined structure, the method comprising:
   providing a source of radiation that emits electromagnetic radiation of a predetermined wavelength;

setting a polarization condition for the electromagnetic radiation using a polarization module in an optical system having two optical polarization conditions;

irradiating the structure to be measured with the electromagnetic radiation using the optical system; and imaging the structure, irradiated with the electromagnetic radiation, onto a detector, wherein the polarization condition set for the electromagnetic radiation is one of the two optical polarization conditions, and the set polarization condition of the electromagnetic radiation is not changed upon impinging the structure.

14. The method as claimed in claim 13, wherein the structure is measured by reflection.

15. The method as claimed in claim 14, wherein the structure is measured by transmission and it is possible to switch between reflection and transmission measurement.

16. The method as claimed in claim 13, wherein the structure is measured by transmission.

17. The method as claimed in claim 13, wherein using the optical system comprises providing illumination optics for irradiating the structure with the electromagnetic radiation and detection optics for imaging the irradiated structure, and optical polarization conditions of the illumination optics and of the detection optics correspond to the optical polarization conditions of the optical system.

18. The method as claimed in claim 17, further comprising setting, independently of each other, the two optical polarization conditions of the illumination optics and the two optical polarization conditions of the detection optics.

19. The method as claimed in claim 13, wherein the optical polarization conditions are two linear polarization conditions and the set polarization condition of the electromagnetic radiation coincides with one of the two linear polarization conditions.

20. The method as claimed in claim 13, wherein the structure has two optical polarization conditions, wherein one of the two optical polarization conditions of the structure coincides with one of the optical polarization conditions of the optical system.

21. The method as claimed in claim 13, further comprising using an optical polarization unit to modify the two optical polarization conditions of the optical system.

22. The method as claimed in claim 21, further comprising using the optical polarization unit to correct polarization aberrations such that a predetermined maximum polarization-dependent wavefront error is not exceeded.

23. The method as claimed in claim 21, wherein the optical polarization unit is set such that there is no variation of the optical polarization conditions of the optical system during measurement of the predetermined structure when the electromagnetic radiation is transmitted or reflected by the predetermined structure.

24. The method as claimed in claim 13, further comprising setting a polarization condition of the electromagnetic radiation so that a contrast of an image of the structure on the detector is maximal.

25. The method as claimed in claim 13, wherein the set polarization condition is not varied during space-resolved measurement of the predetermined structure when the electromagnetic radiation is transmitted or reflected by the predetermined structure.

* * * * *

UNITED STATES PATENT AND TRADEMARK OFFICE
CERTIFICATE OF CORRECTION

PATENT NO.         : 9,134,626 B2
APPLICATION NO.    : 12/517583
DATED              : September 15, 2015
INVENTOR(S)        : Hans-Juergen Mann, Michael Totzeck and Norbert Kerwien It is certified that error appears in the above-identified patent and that said Letters Patent is hereby corrected as shown below:

Specification

Column 2

Line 57, after "error" delete "of"

Line 58, delete "$\lambda / 150$" and insert -- $\lambda / 50$ --

Signed and Sealed this
Twenty-second Day of March, 2016

Michelle K. Lee
*Director of the United States Patent and Trademark Office*